(12) United States Patent
He

(10) Patent No.: US 11,791,229 B2
(45) Date of Patent: Oct. 17, 2023

(54) PROTECTION STRUCTURES IN SEMICONDUCTOR CHIPS AND METHODS FOR FORMING THE SAME

(71) Applicant: YANGTZE MEMORY TECHNOLOGIES CO., LTD., Wuhan (CN)

(72) Inventor: Jialan He, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 111 days.

(21) Appl. No.: 16/862,320

(22) Filed: Apr. 29, 2020

(65) Prior Publication Data

US 2021/0280481 A1   Sep. 9, 2021

Related U.S. Application Data

(63) Continuation of application No. PCT/CN2020/077611, filed on Mar. 3, 2020.

(51) Int. Cl.
| | |
|---|---|
| *H01L 23/31* | (2006.01) |
| *H01L 23/29* | (2006.01) |
| *H01L 23/00* | (2006.01) |
| *H01L 23/522* | (2006.01) |
| *H01L 23/528* | (2006.01) |
| *H01L 23/58* | (2006.01) |

(52) U.S. Cl.
CPC ........ *H01L 23/3121* (2013.01); *H01L 23/293* (2013.01); *H01L 23/315* (2013.01); *H01L 23/3178* (2013.01); *H01L 23/5226* (2013.01); *H01L 23/5283* (2013.01); *H01L 23/562* (2013.01); *H01L 23/564* (2013.01); *H01L 23/585* (2013.01)

(58) Field of Classification Search
CPC . H01L 23/60; H01L 23/3178; H01L 23/5283; H01L 23/562; H01L 23/564; H01L 29/7823; H01L 29/7811; H01L 23/585; H01L 23/5226
See application file for complete search history.

(56) References Cited

U.S. PATENT DOCUMENTS

| | | | | |
|---|---|---|---|---|
| 5,807,786 A | * | 9/1998 | Chang | ............... H01L 21/76888 438/467 |
| 6,107,165 A | * | 8/2000 | Jain | ..................... H01L 23/5252 438/467 |
| 7,034,398 B2 | * | 4/2006 | Kajita | ............... H01L 21/76846 257/E21.585 |

(Continued)

FOREIGN PATENT DOCUMENTS

| | | |
|---|---|---|
| CN | 105374765 A | 3/2016 |
| CN | 106206542 A | 12/2016 |

(Continued)

*Primary Examiner* — Dale E Page
*Assistant Examiner* — Abbigale A Boyle
(74) *Attorney, Agent, or Firm* — BAYES PLLC

(57) ABSTRACT

Embodiments of semiconductor chips and fabrication methods thereof are disclosed. In one example, a semiconductor chip includes a main chip region and a protection structure surrounding the main chip region in a plan view. The protection structure includes a dielectric layer and a conductive portion in the dielectric layer. The conductive portion includes a conductive layer and a core having a material different from that of the conductive layer.

8 Claims, 14 Drawing Sheets

(56) References Cited

U.S. PATENT DOCUMENTS

| | | | | |
|---|---|---|---|---|
| 7,223,673 | B2 * | 5/2007 | Wang | H01L 23/562 |
| | | | | 438/460 |
| 7,335,588 | B2 * | 2/2008 | Yang | H01L 21/76849 |
| | | | | 438/638 |
| 7,521,364 | B2 * | 4/2009 | Chen | H01L 45/144 |
| | | | | 438/692 |
| 7,569,475 | B2 * | 8/2009 | Yang | H01L 23/53223 |
| | | | | 438/618 |
| 7,572,711 | B2 * | 8/2009 | Park | H01L 28/91 |
| | | | | 438/396 |
| 7,956,386 | B2 * | 6/2011 | Bae | H01L 23/5226 |
| | | | | 257/667 |
| 7,985,645 | B2 * | 7/2011 | Park | H01L 28/91 |
| | | | | 438/253 |
| 8,188,584 | B1 * | 5/2012 | Berry | H01L 24/94 |
| | | | | 438/460 |
| 8,324,098 | B2 * | 12/2012 | Aklik | H01L 21/76847 |
| | | | | 438/626 |
| 8,940,635 | B1 * | 1/2015 | Chi | H01L 23/53266 |
| | | | | 438/631 |
| 9,559,059 | B2 * | 1/2017 | Zhang | H01L 21/76882 |
| 9,893,071 | B2 * | 2/2018 | Kim | H01L 27/10885 |
| 10,249,574 | B2 * | 4/2019 | Ling | H01L 21/78 |
| 10,256,300 | B2 * | 4/2019 | Natsume | H01L 21/76264 |
| 10,276,514 | B1 * | 4/2019 | Wang | H01L 21/78 |
| 10,403,729 | B2 * | 9/2019 | Lee | H01L 21/76849 |
| 11,133,268 | B2 * | 9/2021 | Sinha | H01L 21/0337 |
| 2003/0038369 | A1 * | 2/2003 | Layadi | H01L 23/53266 |
| | | | | 257/E21.585 |
| 2004/0084777 | A1 * | 5/2004 | Yamanoue | H01L 23/585 |
| | | | | 257/E21.244 |
| 2018/0197950 | A1 * | 7/2018 | Natsume | H01L 23/562 |
| 2019/0287932 | A1 | 9/2019 | Hu et al. | |

FOREIGN PATENT DOCUMENTS

| | | |
|---|---|---|
| CN | 108878378 A | 11/2018 |
| CN | 110197822 A | 9/2019 |

* cited by examiner

PROTECTION STRUCTURES IN SEMICONDUCTOR CHIPS AND METHODS FOR FORMING THE SAME

CROSS-REFERENCE TO RELATED APPLICATIONS

This application is continuation of International Application No. PCT/CN2020/077611, filed on Mar. 3, 2020, entitled "PROTECTION STRUCTURES IN SEMICONDUCTOR CHIPS AND METHODS FOR FORMING THE SAME," which is hereby incorporated by reference in its entirety.

BACKGROUND

Embodiments of the present disclosure relate to semiconductor devices and fabrication methods thereof.

In applications where the semiconductor chips must be shielded from the adverse effects such as heat, oxygen, and moisture, hermetic packages (also known as "hermetic seal) provide the proper protection. By design, a hermetic seal prevents gases and liquids from entering the package cavity where the die is mounted. Besides heat, oxygen, and moisture, semiconductor chips are also sensitive to electrostatic discharge (ESD). ESD-induced failures in semiconductors can be seen in the form of leakage, short, burnout, contact damage, gate oxide rupture, and resistor-metal interface damage. To mitigate the ESD-induced failures, an ESD protection circuit is designed to turn on in response to an ESD event, clamping the voltage at the bond pad.

SUMMARY

Embodiments of semiconductor chips and fabrication methods thereof are disclosed herein.

In one example, a semiconductor chip includes a main chip region and a protection structure surrounding the main chip region in a plan view. The protection structure includes a dielectric layer and a conductive portion in the dielectric layer. The conductive portion includes a conductive layer and a core having a material different from that of the conductive layer.

In another example, a semiconductor chip includes a main chip region and a protection structure surrounding the main chip region in a plan view. The protection structure includes a single conductive portion. The single conductive portion includes a conductive layer and a core surrounded by the conductive layer in a side view.

In still another example, a method for forming a protection structure of a semiconductor chip is disclosed. A trench surrounding a main chip region of the semiconductor chip in a plan view is formed. A conductive portion is formed to fully fill the trench. The conductive portion includes a conductive layer and a core having a material different from that of the conductive layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
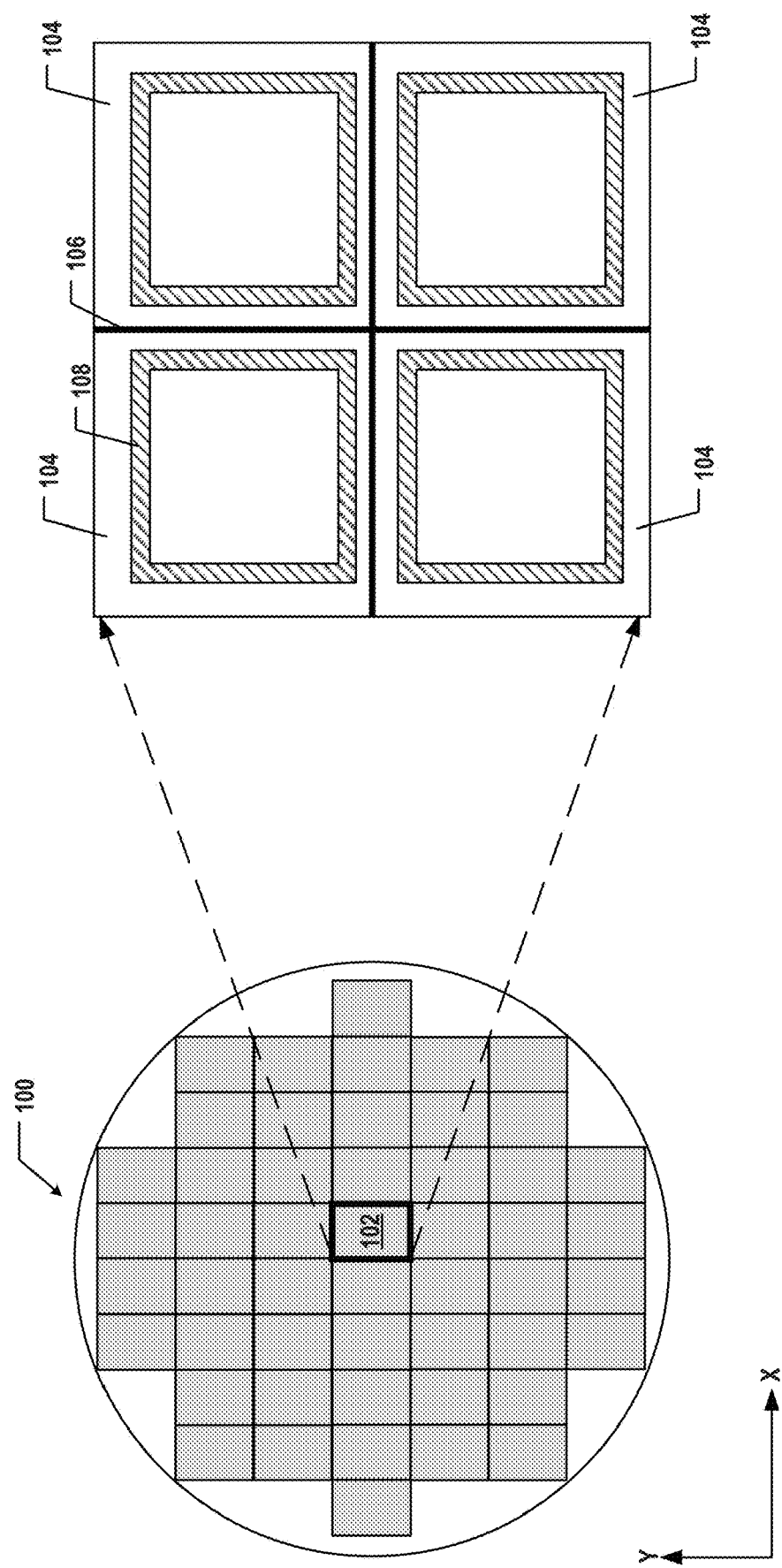
FIG. 1 illustrates a plan view of a wafer having a plurality of semiconductor chips each having a protection structure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a "wafer" is a piece of a semiconductor material for semiconductor devices to build in and/or on it and that can undergo various fabrication processes before being separated into dies.

In semiconductor chips, protection structures for preventing various types of damages, such as ESD, oxygen, moisture, and mechanical damages, can be formed for each chip. For example, FIG. 1 illustrates a plan view of a wafer 100 having a plurality of semiconductor chips 104 each having a protection structure 108. Wafer 100 includes multiple shots 102 each including four dies, referred to herein as semiconductor chips 104, separated by scribe lines 106. As shown in FIG. 1, each semiconductor chip 104 has an adjacent semiconductor chip 104 in a first direction (x-direction) and another adjacent semiconductor chip 104 in a second direction (y-direction) perpendicular to the first direction. Each semiconductor chip 104 includes a protection structure 108 for protecting the semiconductor devices from damages, such as ESD, oxygen, moisture, and mechanical damages.

Figure 2:
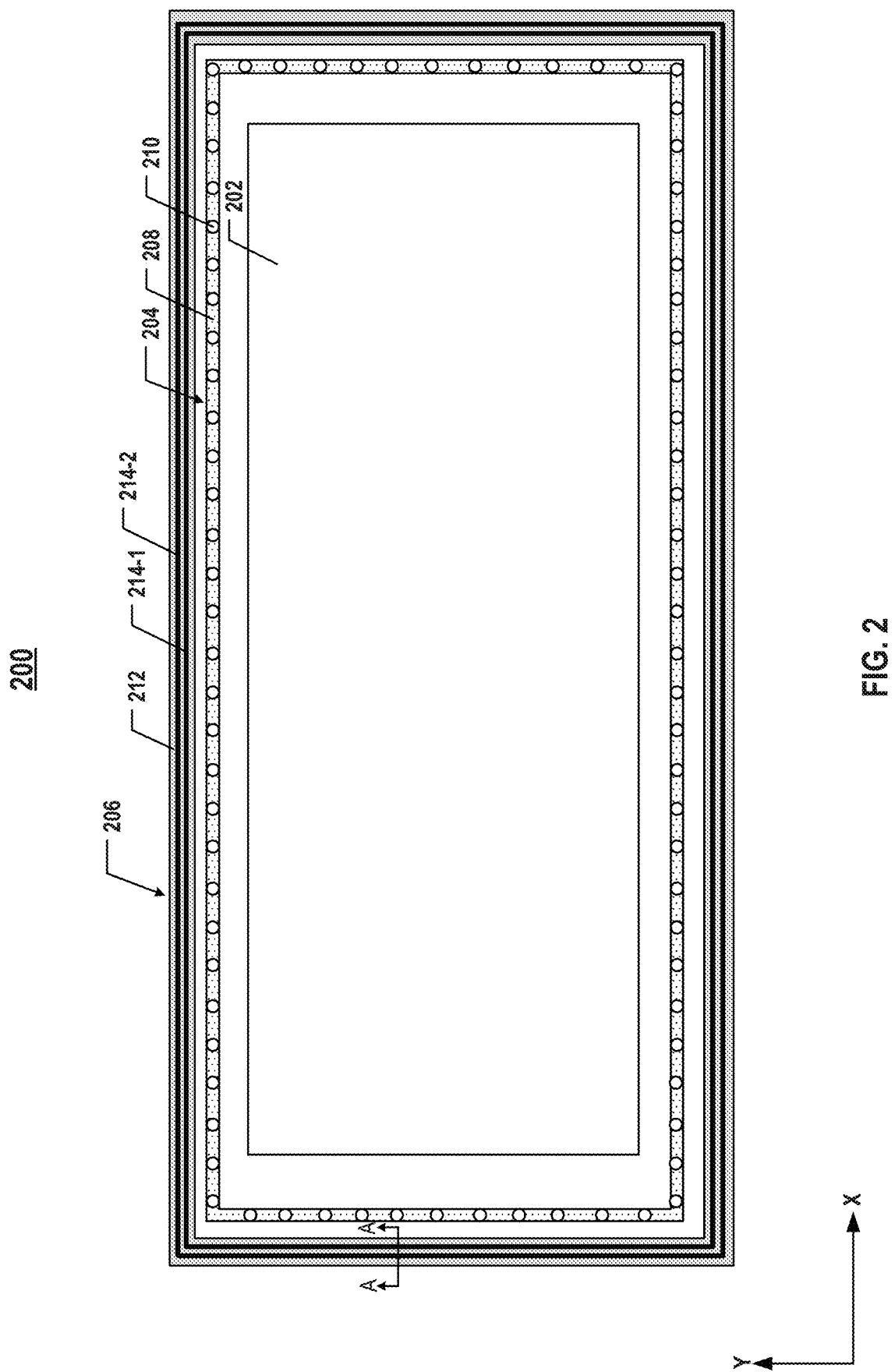
FIG. 2 illustrates a plan view of a semiconductor chip having a protection structure.

For example, FIG. 2 illustrates a plan view of a semiconductor chip 200 having a protection structure. Semiconductor chip 200 is one example of semiconductor chip 104 having protection structure 108 in FIG. 1. Semiconductor chip 200 includes a main chip region 202 to be protected by the protection structure. The protection structure in this example includes two separate parts: an inner guard ring 204 and an outer seal ring 206 as shown in the plan view. It is understood that the plan view of FIG. 2 may be at a cross-section in any suitable plane defined by the x-axis and y-axis parallel to the substrate surface. Inner guard ring 204 includes an inner dielectric layer 208 and a plurality of metal vertical interconnect accesses (VIAs) 210 in inner dielectric layer 208. Outer seal ring 206 includes an outer dielectric layer 212 and multiple metal layers 214-1 and 214-2 in outer dielectric layer 212. Although multiple metal layers 214-1 and 214-2 may provide good hermetic seal against moisture and oxygen, the increased number of metal layers 214-1 and 214-2 in outer seal ring 206 as well as the separate arrangement of inner guard ring 204 and outer seal ring 206 limit the dimensions of metal layers 214-1 and 214-2, which thus may suffer from yield loss and protection failures.

Figure 3:
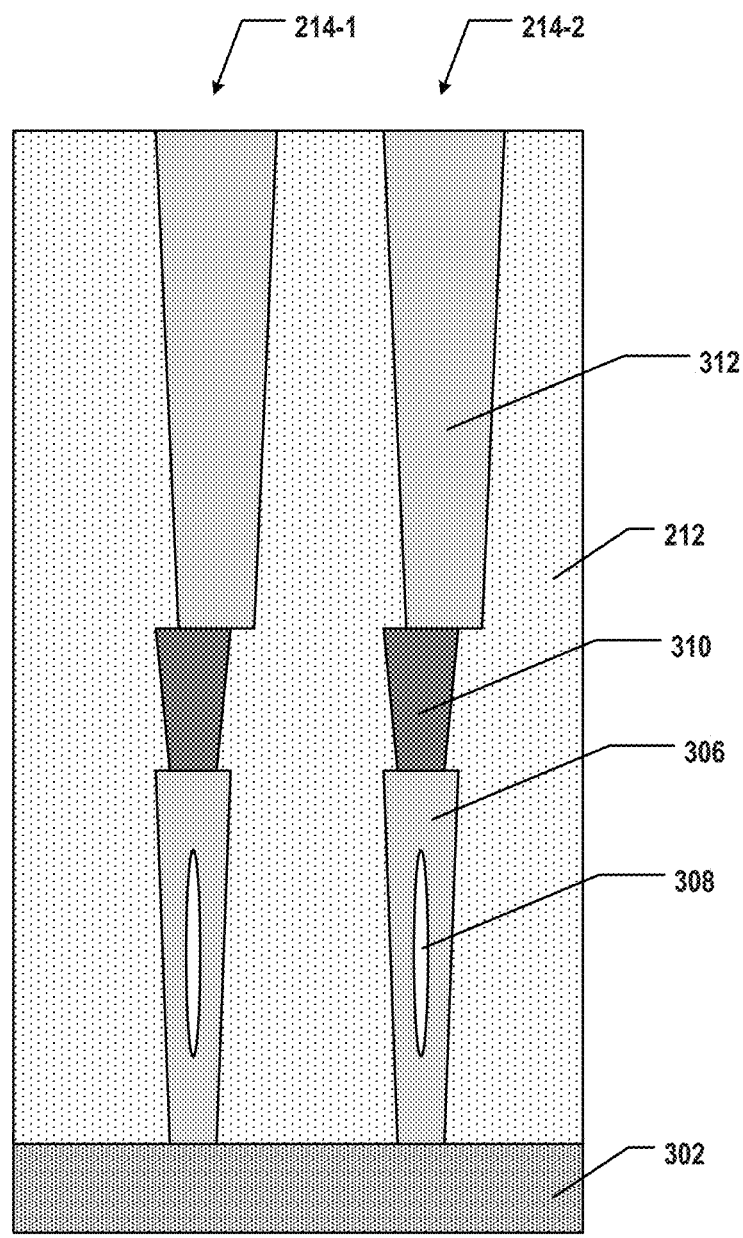
FIG. 3 illustrates a side view of a portion of the protection structure in FIG. 2.

For example, FIG. 3 illustrates a side view of a portion of the protection structure in FIG. 2, i.e., at the cross-section through outer seal ring 206 along the line A-A in FIG. 2. The fabrication processes for forming the protection structure include lithography, etching multiple parallel trenches for metal layers 214-1 and 214-2 in outer dielectric layer 212, depositing metals into the multiple trenches, and chemical mechanical polishing (CMP). Since the limited space for forming the protection structure is occupied by both inner guard ring 204 and outer seal ring 206, the width of each trench for metal layer 214-1 or 214-2 is limited, for example, in several tens of nanometers (nm). Due to the nature of metal deposition in a narrow trench by chemical vapor deposition (CVD), seams and voids are very likely formed in metal layers 214-1 and 214-2. Moreover, after the CMP process, the voids or seams are exposed, thereby trapping particles in the following processes, which eventually may spill and cause defects in metal layers 214-1 and 214-2 (e.g., bumps, peelings, graves, seams, voids, metal missing, etc.). For example, as shown in FIG. 3, each metal layer 214-1 or 214-2 includes a lower metal layer 306 on a substrate 302, which may trap defects 308 therein.

In addition to defects, the limited dimensions of a trench may also cause overlay issues, for example, misalignment, when making upper contacts of metal layers 214-1 and 214-2. For example, as shown in FIG. 3, each metal layer 214-1 or 214-2 further includes a VIA 310 above and in contact with respective lower metal layer 306 and an upper metal layer 312 above and in contact with VIA 310. The misalignment between lower metal layer 306 and VIA 310 or between VIA 310 and upper metal layer 312 may cause damages to outer dielectric layer 212 or metal layers 214-1 and 214-2. Accordingly, the protection structure shown in FIGS. 2 and 3 suffers from defects, leading to yield loss (e.g., bit line missing or bridge in memory devices or metal routing failure in logic devices) and protection failures.

Various embodiments in accordance with the present disclosure provide improved protection structures in semiconductor chips and fabrication methods thereof with yield enhancement due to reduction of defects as wells as higher robustness against moisture, oxygen, cut damages, and ESD. The protection structures disclosed herein can provide a wider process window for various fabrication processes, such as etching, filling, CMP, lithography overlay, etc., to reduce the occurrence of defects. In some embodiments, a single conductive portion replaces the multiple parallel metal layers (e.g., in outer seal ring 206 in FIG. 2), which increases the alignment margin without sacrificing the hermetic seal. In some embodiments, a dual trench-filling process using gap-filling materials is applied to form the conductive portion, which can reduce the formations of voids and seams. In some embodiments, the separate guide ring and seal ring (e.g., inner guard ring 204 and outer seal ring 206 in FIG. 2) are merged in the protection structures disclosed herein, which can further ease the dimension limits of the conductive portion in the protection structure.

Figure 4:
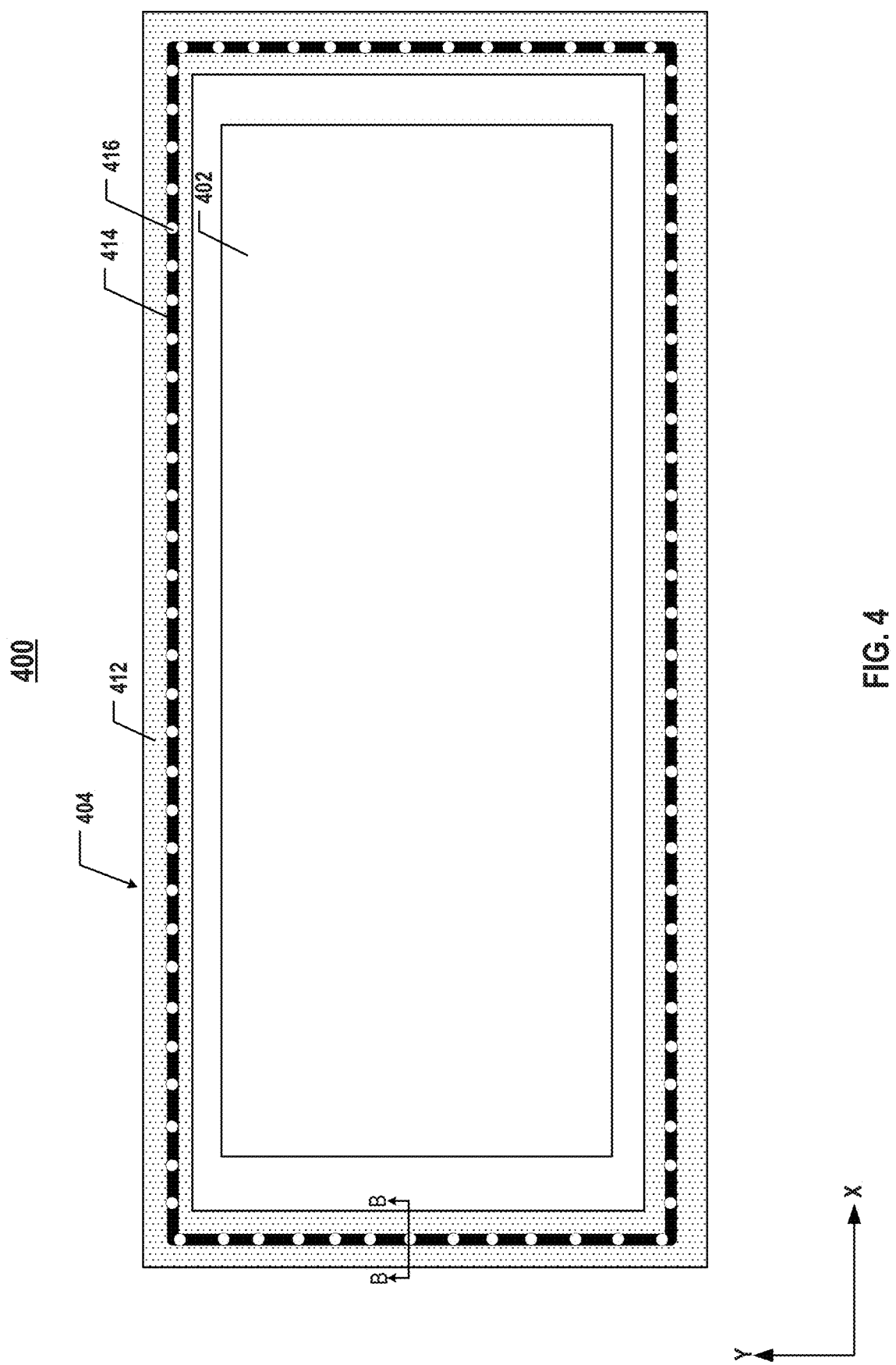
FIG. 4 illustrates a plan view of an exemplary semiconductor chip having a protection structure, according to some embodiments of the present disclosure.

FIG. 4 illustrates a plan view of an exemplary semiconductor chip 400 having a protection structure 404, according to some embodiments of the present disclosure. Semiconductor chip 400 is a small block of semiconductor material (also knowns as a "die") of a wafer on which a given functional circuit (e.g., a semiconductor device) is fabricated, according to some embodiments. In some embodiments, semiconductor chip 400 includes a main chip region 402 in which semiconductor devices can be formed. The semiconductor devices that can be fabricated in main chip region 402 of semiconductor chip 400 can include any suitable logic devices (e.g., central processing unit (CPU), graphics processing unit (GPU), and application processor (AP)), volatile memory devices (e.g., dynamic random-access memory (DRAM) and static random-access memory (SRAM)), non-volatile memory devices (e.g., NAND Flash memory, NOR Flash memory), or any combinations thereof in a 2D, 2.5D, or 3D architecture. Various types of device patterns with different shapes and/or sizes can be formed in main chip region 402 of semiconductor chip 400 during different fabrication stages including, but not limited to, implantation areas, interconnect lines, contact vias, channels, trenches, plates, etc.

As shown in FIG. 4, semiconductor chip 400 also includes protection structure 404 surrounding main chip region 402 in the plan view, according to some embodiments. It is understood that the plan view of FIG. 4 may be at a cross-section in any suitable plane defined by the x-axis and y-axis parallel to the substrate surface. In some embodiments, protection structure 404 includes four sides connected to enclose main chip region 402 in the plan view. It is understood that although protection structure 404 illustrated in FIG. 4 has a rectangle shape, in other examples, protection structure 404 may have any other suitable shapes, such as square, circle, oval, etc., for example, depending on the shape of main chip region 402.

Protection structure 404 can be configured to provide protection to the semiconductor devices in main chip region 402 from various types of damages including, but not limited to, heat, gases (e.g., oxygen), liquids (e.g., moisture), mechanical damages (e.g., cutting), and electrical damages (e.g., ESD). Different from the protecting structure of semiconductor chip 200 in FIG. 2, which includes separate inner guard ring 204 and outer seal ring 206 having hermetic seal and electrostatic protection functions, respectively, protection structure 404 in semiconductor chip 400 merges the functions and structures of inner guard ring 204 and outer seal ring 206, according to some embodiments. That is, without having two separate ring structures, protection structure 404 can still provide hermetic seal to protect the semiconductor devices in main chip region 402 from mechanical damages during cutting and to block entry of external moisture and oxygen into main chip region 402, as well as can protect the semiconductor devices in main chip region 402 from ESD. In some embodiments, protection structure 404 is attached to a ceramic or metal lid in the packaging of semiconductor chip 400 to form hermetic seal. In some embodiments, protection structure 404 is electrically connected to an ESD protection circuit and/or the ground.

In some embodiments, protection structure 404 includes a dielectric layer 412 and a conductive portion 414 in dielectric layer 412. As shown in FIG. 4, dielectric layer 412 can fill the entire protection structure 404 except for the area occupied by conductive portion 414. That is, conductive portion 414 of protection structure 404 can be electrically insulated by dielectric layer 412. By merging separate dielectric layers in the seal ring and guide ring into single dielectric layer 412, the widths of dielectric layer 412 (in the x-direction and/or the y-direction) can be increased. Dielectric layer 412 can include any dielectric materials including, but not limited to, silicon oxide, silicon nitride, silicon oxynitride, high dielectric-constant (k) dielectrics (e.g., aluminum oxide, hafnium oxide, zirconium oxide, etc.), or any combination thereof.

In some embodiments, conductive portion 414 of protection structure 404 includes a plurality of contacts 416 electrically connecting conductive portion 414 to an ESD protection circuit and or the ground. For example, contacts 416 may be electrically connected to the ESD protection circuit and/or the ground through an interconnect layer of semiconductor chip 400, such as a middle-end-of-line (MEOL) interconnect layer or a back-end-of-line (BEOL) interconnect layer. As used herein, the term "contacts" (also referred to herein as "interconnects") includes lateral interconnect lines and VIAs. Contacts 416 can include conductive materials including, but not limited to, tungsten (W), cobalt (Co), copper (Cu), aluminum (Al), silicides, or any combination thereof. In some embodiments, contacts 416 are eventually spaced apart along the four sides of protection structure 404 to reduce the resistance. It is understood that the arrangement (e.g., the number and pitch) of contacts 416 is not limited to the example in FIG. 4 and may be any suitable arrangements in other examples.

Different from the protection structure of semiconductor chip 200 in FIG. 2, which includes multiple metal layers 214-1 and 214-2, protection structure 404 includes single conductive portion 414 as shown in FIG. 4, according to some embodiments. Consequently, the dimensions of conductive portion 414 can be increased compared with each metal layer 214-1 or 214-2. In some embodiments, single conductive portion 414 is a continuous structure with nominally the same width (in the x-direction and the y-direction)

extending along the four sides of protection structure 404 in the plan view. In some embodiments, the width of conductive portion 414 is greater than about 100 nm, such as greater than 100 nm. For example, the width of conductive portion 414 may be between about 100 nm and about 10 μm, such as between 100 nm and 10 μm (e.g., 100 nm, 200 nm, 300 nm, 400 nm, 500 nm, 600 nm, 700 nm, 800 nm, 900 nm, 1 μm, 2 μm, 3 μm, 4 μm, 5 μm, 6 μm, 7 μm, 8 μm, 9 μm, 10 μm, any range bounded by the lower end by any of these values, or in any range defined by any two of these values).

Figure 5A:
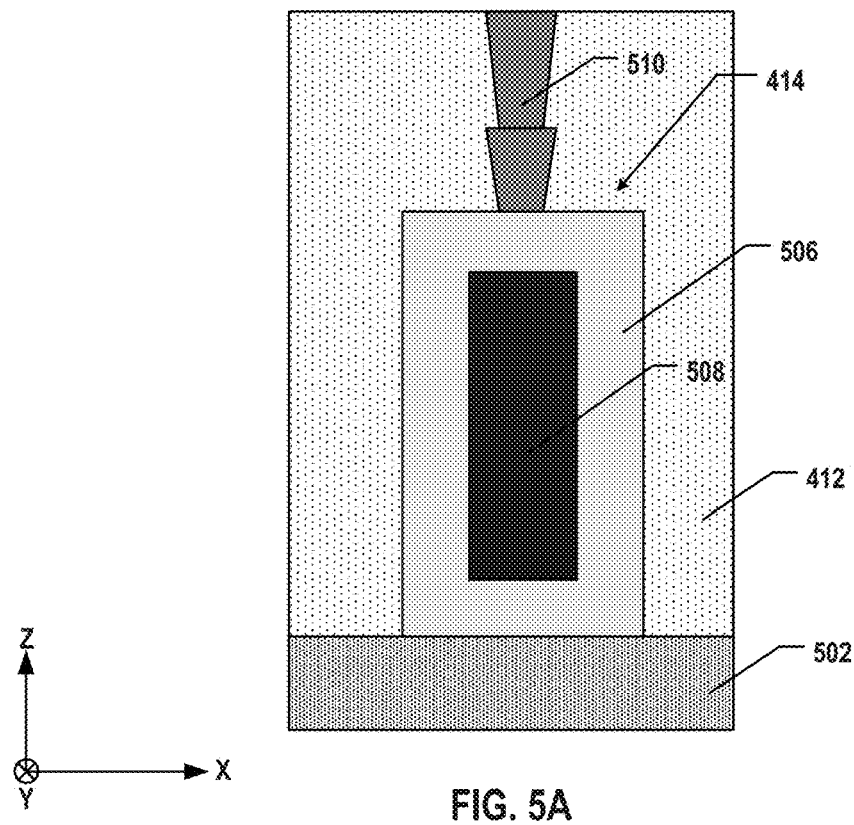
FIG. 5A illustrates a side view of an exemplary protection structure in FIG. 4, according to some embodiments of the present disclosure.

FIG. 5A illustrates a side view of exemplary protection structure 404 in FIG. 4, according to some embodiments of the present disclosure. For example, the side view of FIG. 5A may be at the cross-section through protection structure 404 along the line B-B in FIG. 4. As shown in FIG. 5A, protection structure 404 is formed on a substrate 502, according to some embodiments. Substrate 502 can include silicon (e.g., single crystalline silicon, c-Si), silicon germanium (SiGe), gallium arsenide (GaAs), germanium (Ge), silicon on insulator (SOI), or any other suitable materials. In some embodiments, substrate 502 is doped with p-type dopants or n-type dopants to a desired doping level to assist protection structure 404 in preventing ESD. It is noted that x-, y-, and z-axes are included in FIG. 5A to illustrate the spatial relationships of the components in semiconductor chip 400. Substrate 502 includes two lateral surfaces extending laterally in the x-y plane: a front surface on the front side of the wafer, and a back surface on the backside opposite to the front side of the wafer. The x- and y-directions are two orthogonal directions in the wafer plane, and the z-axis is perpendicular to both the x- and y-axes. As used herein, whether one component (e.g., a layer or a device) is "on," "above," or "below" another component (e.g., a layer or a device) of semiconductor chip 400 is determined relative to substrate 502 of semiconductor chip 400 in the z-direction (the vertical direction perpendicular to the x-y plane) when substrate 502 is positioned in the lowest plane of semiconductor chip 400 in the z-direction. The same notion for describing spatial relationships is applied throughout the present disclosure.

In some embodiments, conductive portion 414 includes a conductive layer 506 and a core 508. Conductive portion 414 can further include one or more contacts 510 above and in contact with conductive layer 506 in the side view, as shown in FIG. 5A. In some embodiments, dielectric layer 412 includes one or more interlayer dielectric (ILD) layers (also known as "intermetal dielectric (IMD) layers") in which the conductive components (e.g., conductive layer 506 and contact 510) of conductive portion 414 can form. In some embodiments, core 508 is surrounded by conductive layer 506 in the side view, as shown in FIG. 5A. That is, conductive layer 506 can enclose core 508, separating core 508 from dielectric layer 412.

In some embodiments, conductive layer 506 and core 508 of conductive portion 414 include different materials. Conductive layer 506 can include a metal, such as W, Cu, Al, Co, or any combination thereof. In one example, conductive layer 506 includes W. Core 508 can include a non-metal material. As described below in detail, core 508 includes a gap-filling material, which can fill the trench with fewer voids and seams compared with a metal material deposited into the trench, for example, using CVD, according to some embodiments. For example, the gap-filling material may include at least one of a spin-on coating dielectric (SOD), a spin-on coating carbon (SOC), a fluid organic material, or a fluid inorganic material. In some embodiments, core 508 includes SOD (e.g., flowable oxide ($FO_x$)) or SOC formed by a spin-coating process.

In some embodiments, conductive portion 414 further includes contacts 510 above and in contact with the top surface of conductive layer 506. Contacts 510 can be stacked in multiple levels to electrically connect conductive portion 414 to the desired interconnect layer in semiconductor chip 400. In some embodiments, contacts 510 include a VIA. In some embodiments, conductive portion 414 has nominally the same width (in the x-direction) along the vertical direction in the side view, for example, greater than 100 nm. In some embodiments, conductive portion 414 has a trapezoid shape in the side view. For example, the width (in the x-direction) of conductive portion 414 may increase from the bottom to the top, and the average width or the width in the middle of conductive portion 414 in the vertical direction may be greater than 100 nm. In any event, the width at the top surface of conductive layer 506 is not less than the width of conductive portion 414, for example, greater than 100 nm. Compared with each of multiple metal layers 214-1 and 214-2 of the protection structure in FIG. 3 in which upper metal layer 312 or VIA 310 needs to be precisely aligned with lower metal layer 306 having the width in server tens of nanometers, contact 510 can land on the top surface of conductive layer 506 having the width of greater than 100 nm. As a result, the overlay margin in the protection structure can be increased, thereby improving the production yield.

Figure 5B:
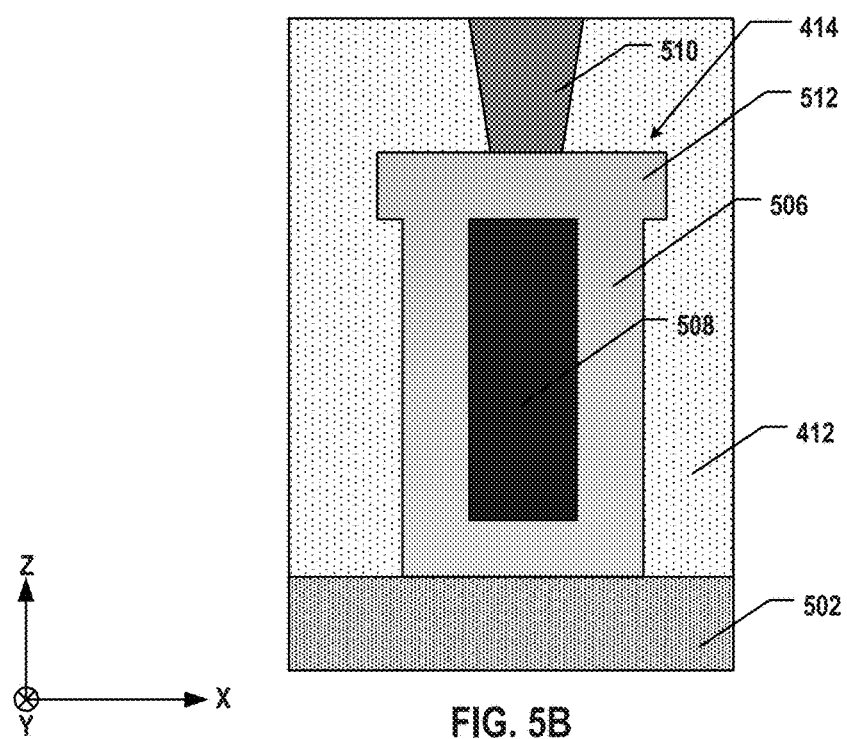
FIG. 5B illustrates a side view of another exemplary protection structure in FIG. 4, according to some embodiments of the present disclosure.

FIG. 5B illustrates a side view of another exemplary protection structure 404 in FIG. 4, according to some embodiments of the present disclosure. Different from protection structure 404 in the example of FIG. 5A, conductive portion 414 in protection structure 404 of the example in FIG. 5B further includes a conductive plug 512 above core 508, according to some embodiments. Conductive plug 512 can be considered the top portion of conductive layer 506 covering core 508, but with a different width (in the x-direction) than the rest of conductive layer 506. That is, the sidewall profile of conductive layer 506 in FIG. 5B may not be smooth and continuous as in the example of FIG. 5A, but rather substantively change, either increasing or decreasing, at conductive plug 512. It is understood that although the width of conductive plug 512 is greater than the rest of conductive layer 506 in FIG. 5B, the width of conductive plug 512 may be less than the rest of conductive layer 506 in other examples. As described below in detail, conductive plug 512 can be formed above the trench in which core 508 is formed in separate step after the filling step forming the rest of conductive layer 506 in the trench. As a result, the width of conductive plug 512 is not limited by the width of the trench and may be adjusted as needed, e.g., larger or smaller than the rest of conductive layer 506.

Figure 9A:
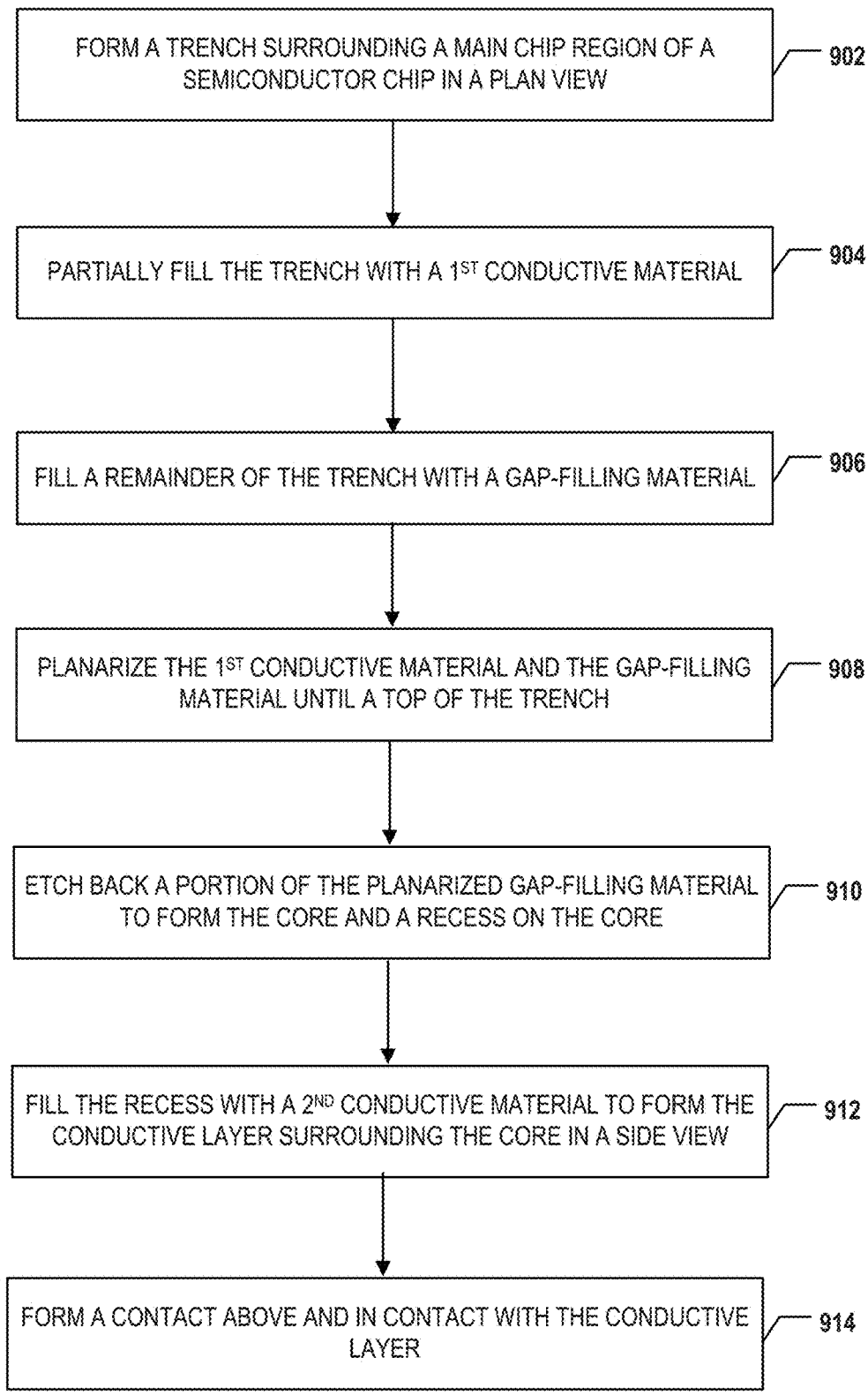
FIG. 9A is a flowchart of an exemplary method for forming a protection structure in a semiconductor chip, according to some embodiments of the present disclosure.

FIGS. 6A-6E illustrate an exemplary fabrication process for forming part of a protection structure in a semiconductor chip, according to some embodiments of the present disclosure. FIGS. 7A-7D illustrate an exemplary fabrication process for forming a protection structure in a semiconductor chip, according to some embodiments of the present disclosure. FIG. 9A is a flowchart of an exemplary method 900 for forming a protection structure in a semiconductor chip, according to some embodiments of the present disclosure. Examples of the protection structure depicted in FIGS. 6A-6E, 7A-7D, and 9A include protection structure 404 depicted in FIGS. 4 and 5A. FIGS. 6A-6E, 7A-7D, and 9A will be described together. It is understood that the operations shown in method 900 are not exhaustive and that other operations can be performed as well before, after, or between any of the illustrated operations. Further, some of the operations may be performed simultaneously, or in a different order than shown in FIG. 900.

Figure 6A:
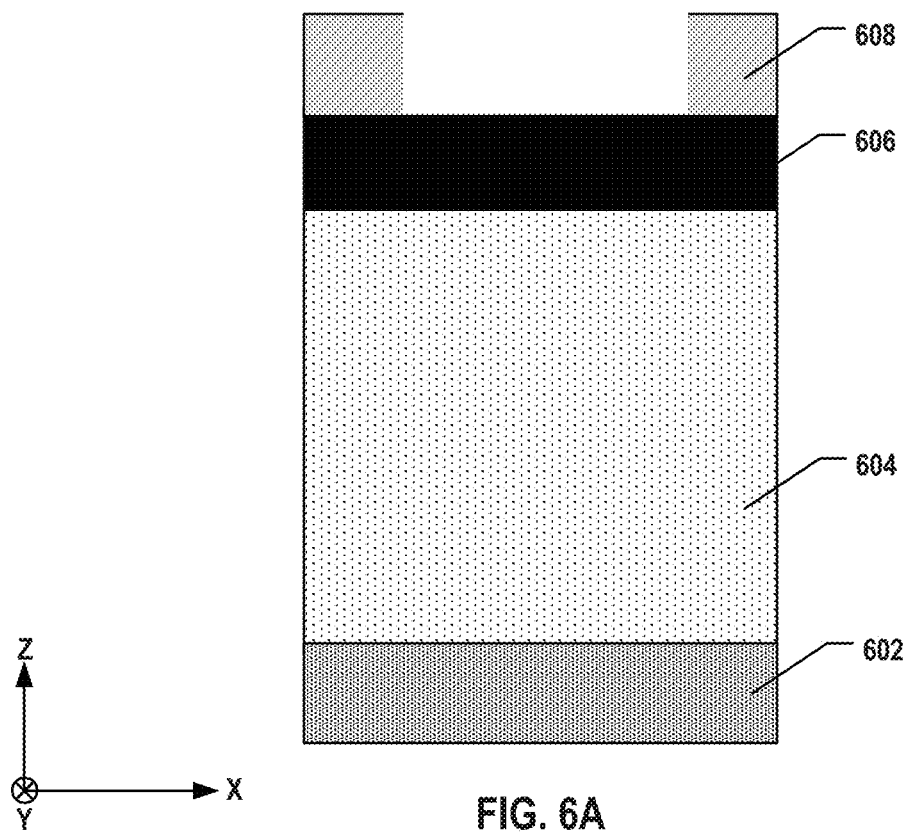
FIGS. 6A-6E illustrate an exemplary fabrication process for forming part of a protection structure in a semiconductor chip, according to some embodiments of the present disclosure.

Referring to FIG. 9A, method 900 starts at operation 902, in which a trench surrounding a main chip region of a semiconductor chip in the plan view is formed. In some embodiments, the width of the trench is greater than about 100 nm, such as greater than 100 nm. As illustrated in FIG. 6A, a dielectric layer 604 is first deposited on a substrate 602 outside of the main chip region (not shown) of the semiconductor chip in which semiconductor devices are formed. It is understood that dielectric layer 604 may be deposited before or after the formation of the semiconductor devices in the main chip region. Dielectric layer 604 can be formed by depositing one or more dielectric materials using one or more thin film deposition processes including, but not limited to, CVD, physical vapor deposition (PVD), atomic layer deposition (ALD), or any combination thereof. In some embodiments, prior to the deposition of dielectric layer 604, substrate 602 is doped with p-type dopants or n-type dopants to a desired doping level using ion implantation and/or thermal diffusion processes.

As illustrated in FIG. 6A, a hard mask 606 is formed on dielectric layer 604 as an etch mask. In some embodiments, carbon or silicon oxynitride is deposited on dielectric layer 604 using one or more thin film deposition processes including, but not limited to, CVD, PVD, ALD, electroplating, electroless plating, or any combination thereof, to form hard mask 606. A photoresist layer 608 is formed on hard mask 606 using spin-coating and/or spray-coating processes, according to some embodiments. Photoresist layer 608 can be patterned using a lithography process to define the area of a trench to be formed in dielectric layer 604. In some embodiments, hard mask 606 is patterned using wet etch and/or dry etch processes to replicate the pattern from photoresist layer 608.

Figure 6B:
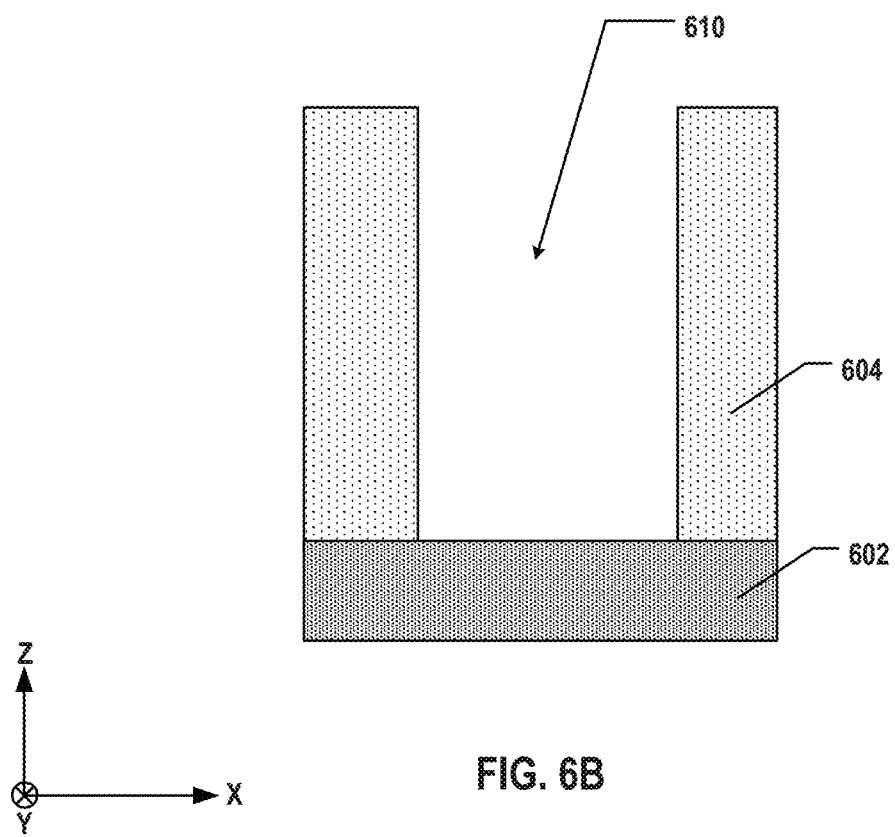

As illustrated in FIG. 6B, a trench 610 is formed in dielectric layer 604. In some embodiments, using patterned hard mask 606 as the etch mask, trench 610 is etched using dry etch and/or wet etch processes, such as reactive ion etch (RIE), through dielectric layer 604 until being stopped by substrate 602. In some embodiments, the width (in the x-direction) of trench 610 is greater than 100 nm. The remainder of hard mask 606 can be removed using dry etch and/or wet etch processes after the formation of trench 610.

After the formation of the trench, a conductive portion can be formed to fully fill the trench. The conductive portion can include a conductive layer and a core having a material different from that of the conductive layer. One example of forming the conductive portion is illustrated with respect to operations 904, 906, 908, 910, 912, and 914 in method 900 of FIG. 9A. Method 900 proceeds to operation 904, as illustrated in FIG. 9A, in which the trench is partially filled with a first conductive material. In some embodiments, to partially fill the trench, the first conductive material is deposited over a sidewall and a bottom of the trench. The first conductive material can include a metal.

Figure 6C:
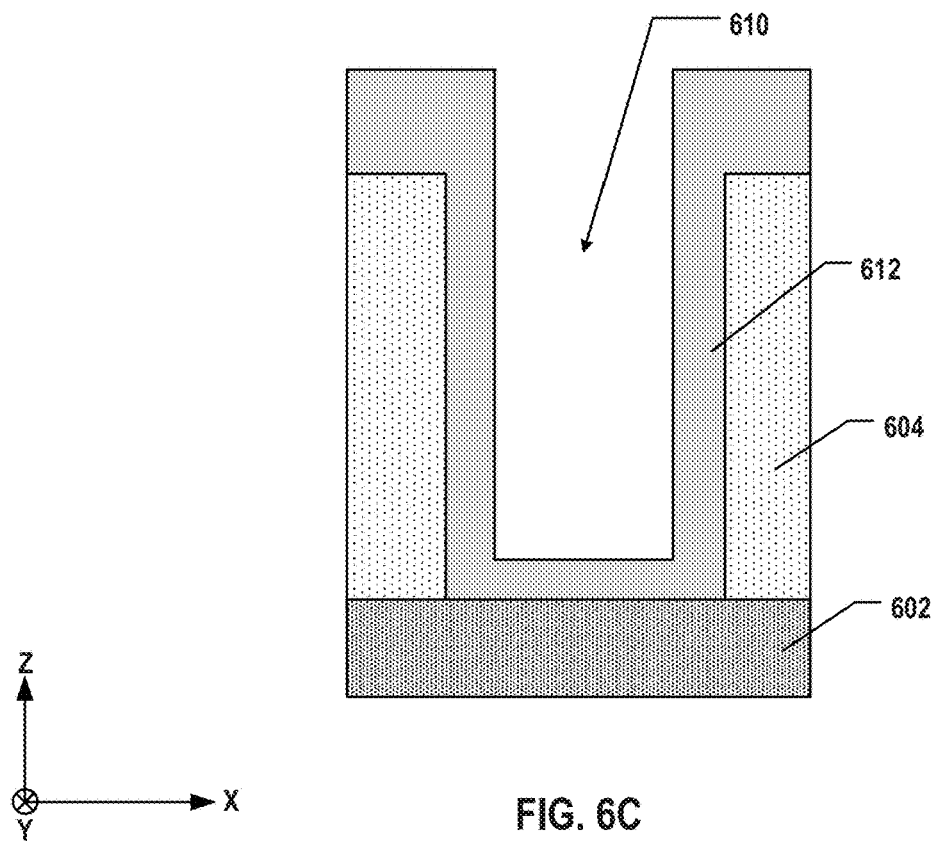

As illustrated in FIG. 6C, trench 610 is partially filled with a conductive material 612. That is, trench 610 is not fully filled with conductive material 612, and only the sidewall and the bottom of trench 610 is filled with conductive material 612, leaving the remainder of trench 610 still open, according to some embodiments. In some embodiments, conductive material 612, such as a metal (e.g., W) is deposited over the sidewall and the bottom of trench 610 using one or more thin film deposition processes including, but not limited to, CVD, PVD, ALD, or any combination thereof. In order not to seal trench 610 by conductive material 612, a conformal coating process, such as ALD, can be used with control of the deposition time and/or cycles. The relatively large width of trench 610 (e.g., greater than 100 nm) can also facilitate the partial filling of trench 610 with conductive material 612. In some embodiments, an adhesion layer and/or a barrier layer, such as titanium/titanium nitride (Ti/TiN), are formed between conductive material 612 and dielectric layer 604 prior to the deposition of conductive material 612 using one or more thin film deposition processes including, but not limited to, CVD, PVD, ALD, or any combination thereof.

Method 900 proceeds to operation 906, as illustrated in FIG. 9A, in which a remainder of the trench is filled with a gap-filling material. In some embodiments, to fill the remainder of the trench, the gap-filling material is spin-coated into the remainder of the trench. The gap-filling material can include at least one of a SOD, a SOC, a fluid organic material, or a fluid inorganic material. Operations 904 and 906 illustrate a dual trench-filling process including a partial filling process with the conductive material, followed by a full filling process with the gap-filling material, which can minimize the occurrence of seams and voids.

Figure 6D:
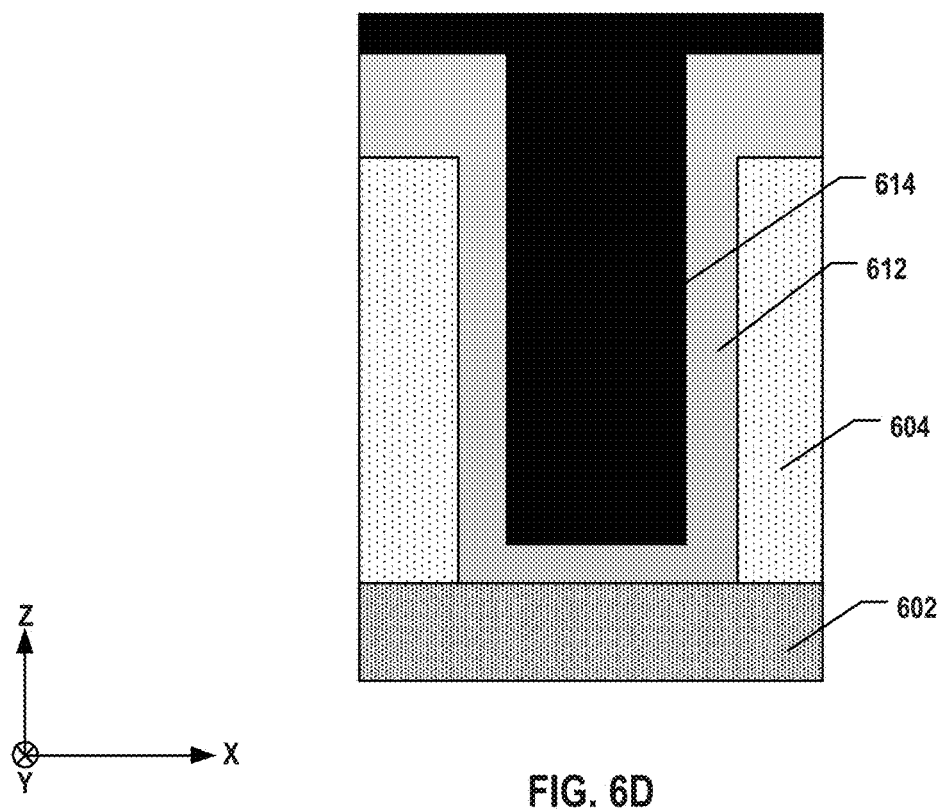

As illustrated in FIG. 6D, the reminder of trench 610 (shown in FIG. 6C) is filled with a gap-filling material 614. As a result, trench 610 can be fully filled with conductive material 612 and gap-filling material 614 without seams and voids that are commonly found after the single trench-filling process without gap-filling material 614. In some embodiments, gap-filling material 614, such as SOD or SOC, fills the remainder of trench 610 using a spin-coating process. A spin-coating process is known to have a better gap-filling capability than CVD, e.g., forming a flat surface without voids and seams. In some embodiments, a post-baking process (e.g., using thermal or laser heating) is performed after the spin-coating process to further prevent the formation of voids or seams.

Figure 6E:
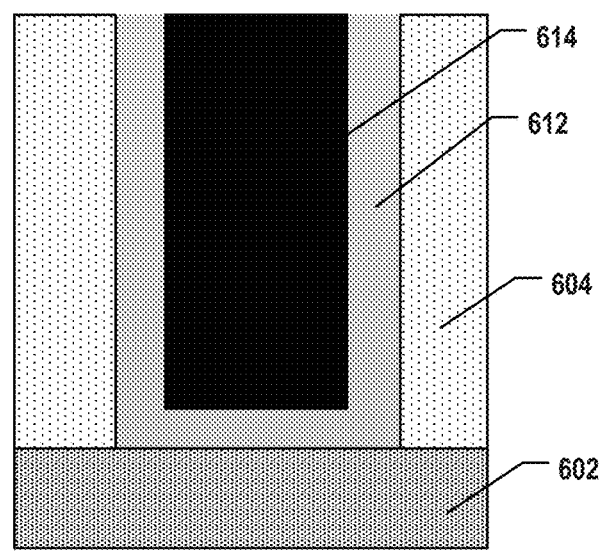

Method 900 proceeds to operation 908, as illustrated in FIG. 9A, in which the first conductive material and the gap-filling material are planarized until the top of the trench. As illustrated in FIG. 6E, conductive material 612 and gap-filling material 614 are planarized, such that the top surface of conductive material 612 and the top surface of gap-filling material 614 are flush with one another as well as with the top of trench 610 (shown in FIG. 6B). In some embodiments, excess conductive material 612 and gap-filling material 614 on the field region outside of trench 610 and above trench 610 are removed using a planarization process, such as CMP, grinding, and/or etch processes, until the top of trench 610. In some embodiments, the CMP process is stopped at the top surface of dielectric layer 604.

Figure 7A:
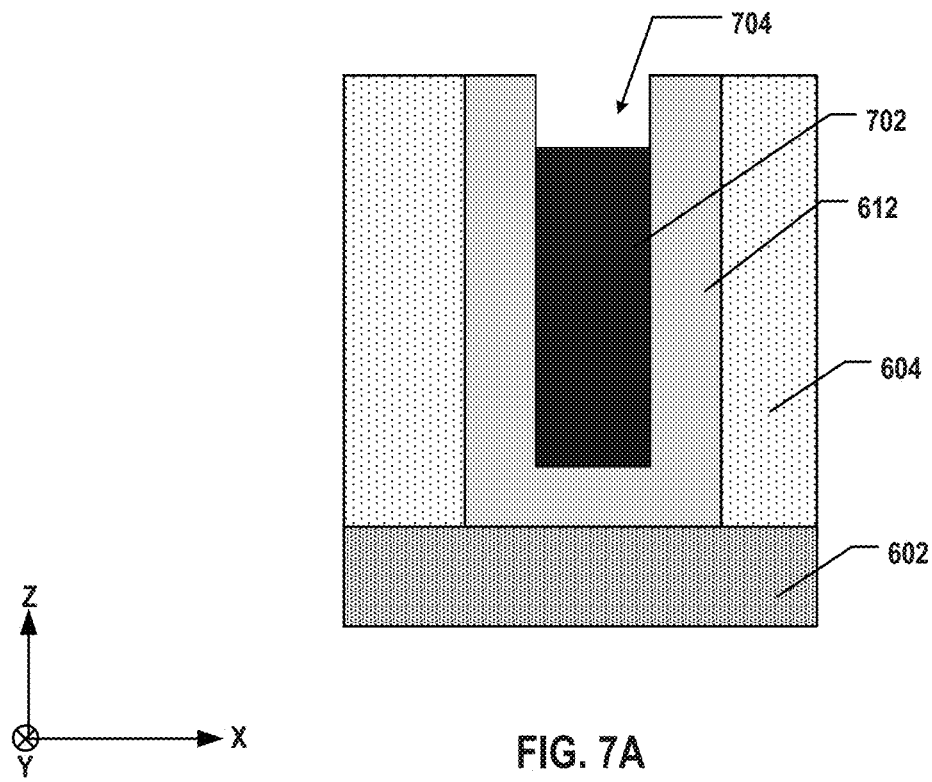
FIGS. 7A-7D illustrate an exemplary fabrication process for forming a protection structure in a semiconductor chip, according to some embodiments of the present disclosure.

Method 900 proceeds to operation 910, as illustrated in FIG. 9A, in which a portion of the planarized gap-filling material is etched back to form the core and a recess on the core. As illustrated in FIG. 7A, a recess 704 is formed on a core 702, which is formed from gap-filling material 614 (shown in FIG. 6E). In some embodiments, the top portion of planarized gap-filling material 614 is etched back using dry etch and/or wet etch processes to form recess 704 below the top surface of conductive material 612. The remainder of gap-filling material 614 in trench 610 thereby forms core 702, according to some embodiments.

Figure 7B:
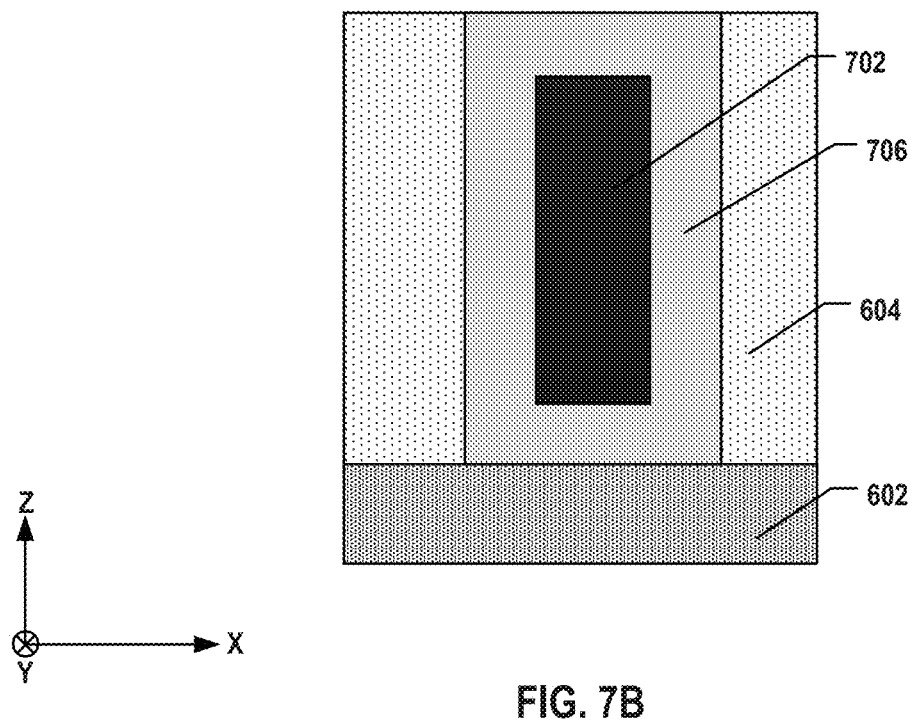

Method 900 proceeds to operation 912, as illustrated in FIG. 9A, in which the recess is filled with a second conductive material to form the conductive layer surrounding the core in the side view. In some embodiments, the first conductive material is the same as the second conductive material. As illustrated in FIG. 7B, a conductive layer 706 surrounding core 702 is formed on substrate 602 in dielectric layer 604. In some embodiments, a conductive material (e.g., the same material as conductive material 612) is deposited using one or more thin film deposition processes including, but not limited to, CVD, PVD, ALD, or any combination thereof, into recess 704 (shown in FIG. 7A) to fill recess 704, followed by a planarized process (e.g., CMP) to remove the excess conductive material above the top surface of dielectric layer 604. Conductive layer 706 surrounding core 702 in the side view is thereby formed, according to some embodiments.

Figure 7C:
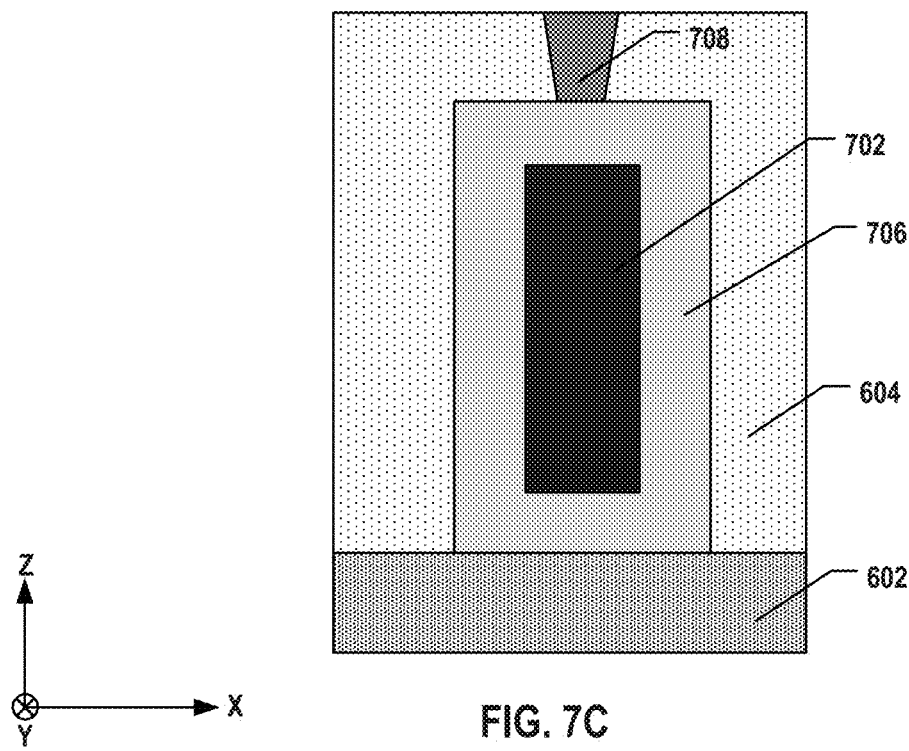

Method 900 proceeds to operation 914, as illustrated in FIG. 9A, in which a contact is formed above and in contact with the conductive layer. As illustrated in FIG. 7C, a contact 708 is formed above and in contact with conductive layer 706. In some embodiments, dielectric layer 604 is extended vertically by depositing another dielectric layer on dielectric layer 604. Contact 708, such as a VIA, can be formed by patterning and etching a contact hole aligned with the top surface of conductive layer 706 using lithography and etch processes (e.g., RIE). One or more conductive materials, such as metals, can be deposited into the contact hole using one or more thin film deposition processes including, but not limited to, CVD, PVD, ALD, or any combination thereof, followed by a planarization process (e.g., CMP) to form contact 708. In some embodiments, a conductive portion including core 702, conductive layer 706 surrounding core 702, and contact 708 above and in contact with conductive layer 706 is thereby formed.

Figure 7D:
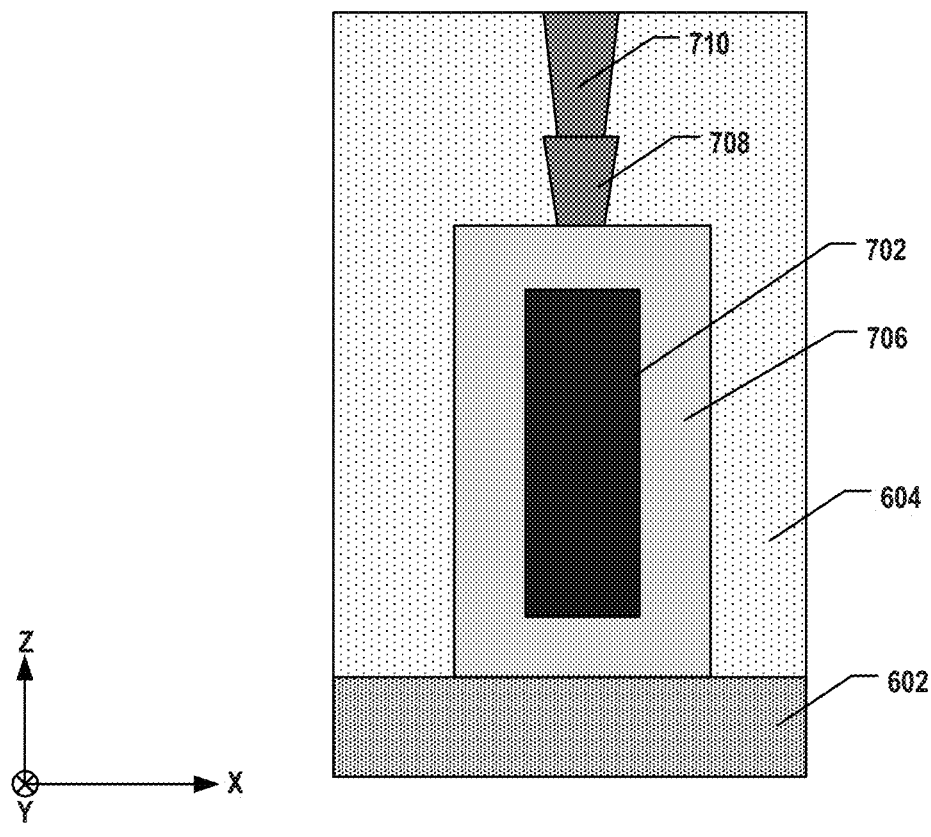

Additional contacts can be stacked up as needed. For example, as illustrated in FIG. 7D, another contact 710 is formed above and in contact with contact 708. In some embodiments, dielectric layer 604 is further extended vertically by depositing another dielectric layer on dielectric layer 604. Contact 710, such as a VIA, can be formed by patterning and etching a contact hole aligned with the top surface of contact 708 using lithography and etch processes (e.g., RIE). One or more conductive materials, such as metals, can be deposited into the contact hole using one or more thin film deposition processes including, but not limited to, CVD, PVD, ALD, or any combination thereof, followed by a planarization process (e.g., CMP) to form contact 710.

Figure 8A:
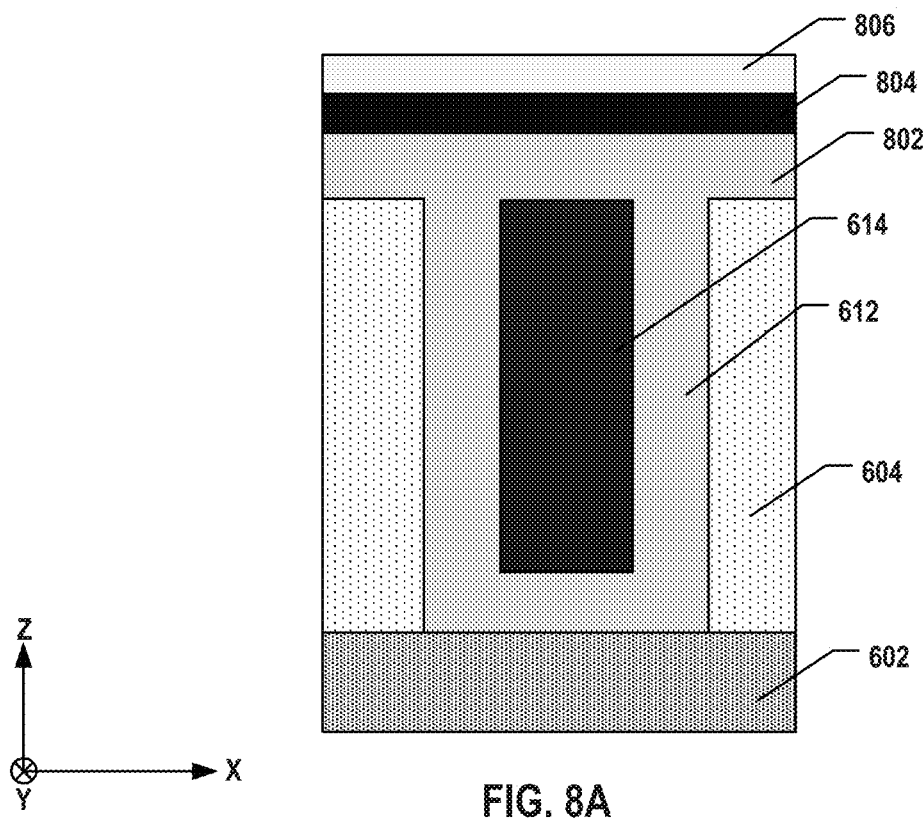
FIGS. 8A-8D illustrate another exemplary fabrication process for forming a protection structure in a semiconductor chip, according to some embodiments of the present disclosure.
Figure 8B:
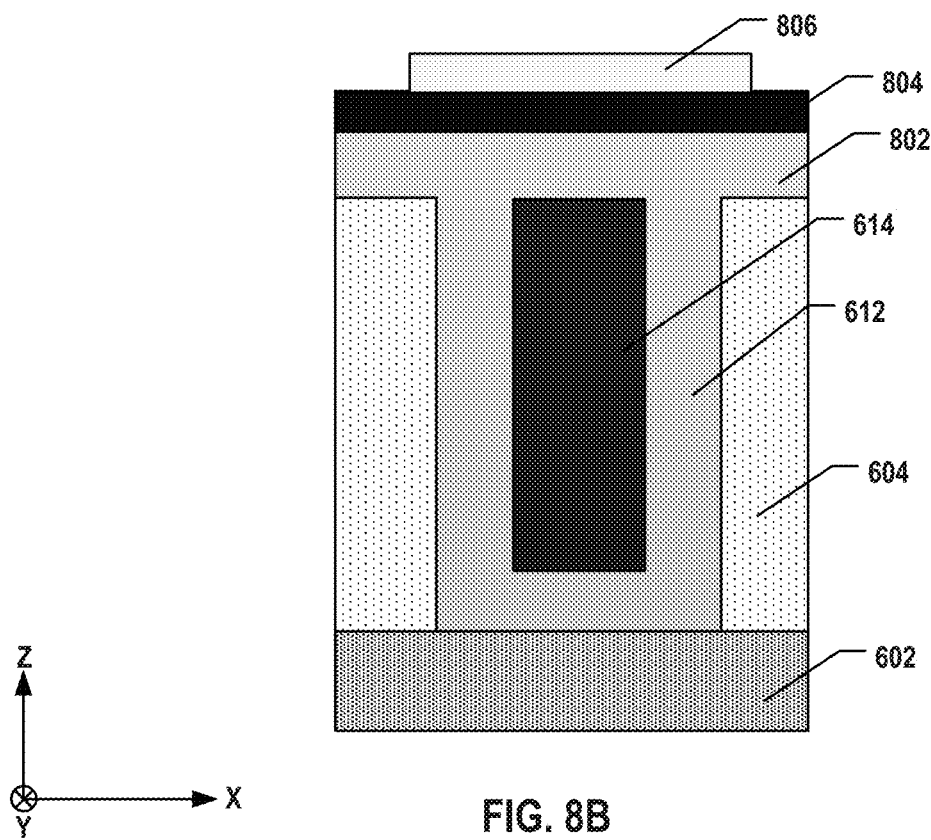

FIGS. 8A-8D illustrate an exemplary fabrication process for forming a protection structure in a semiconductor chip, according to some embodiments of the present disclosure. FIG. 9B is a flowchart of an exemplary method 901 for forming a protection structure in a semiconductor chip, according to some embodiments of the present disclosure. Examples of the protection structure depicted in FIGS. 6A-6E, 8A-8D, and 9B include protection structure 404 depicted in FIGS. 4 and 5B. FIGS. 6A-6E, 8A-8D, and 9B will be described together. It is understood that the operations shown in method 901 are not exhaustive and that other operations can be performed as well before, after, or between any of the illustrated operations. Further, some of the operations may be performed simultaneously, or in a different order than shown in FIG. 901.

Referring to FIG. 9B, method 901 starts at operation 902, in which a trench surrounding a main chip region of a semiconductor chip in the plan view is formed. In some embodiments, the width of the trench is greater than about 100 nm, such as greater than 100 nm. As illustrated in FIG. 6A, dielectric layer 604 is first deposited on substrate 602 outside of the main chip region (not shown) of the semiconductor chip in which semiconductor devices are formed. It is understood that dielectric layer 604 may be deposited before or after the formation of the semiconductor devices in the main chip region. Dielectric layer 604 can be formed by depositing one or more dielectric materials using one or more thin film deposition processes including, but not limited to, CVD, PVD, ALD, or any combination thereof. In some embodiments, prior to the deposition of dielectric layer 604, substrate 602 is doped with p-type dopants or n-type dopants to a desired doping level using ion implantation and/or thermal diffusion processes.

As illustrated in FIG. 6A, hard mask 606 is formed on dielectric layer 604 as an etch mask. In some embodiments, carbon or silicon oxynitride is deposited on dielectric layer 604 using one or more thin film deposition processes including, but not limited to, CVD, PVD, ALD, electroplating, electroless plating, or any combination thereof, to form hard mask 606. Photoresist layer 608 is formed on hard mask 606 using spin-coating and/or spray-coating processes, according to some embodiments. Photoresist layer 608 can be patterned using a lithography process to define the area of a trench to be formed in dielectric layer 604. In some embodiments, hard mask 606 is patterned using wet etch and/or dry etch processes to replicate the pattern from photoresist layer 608.

As illustrated in FIG. 6B, trench 610 is formed in dielectric layer 604. In some embodiments, using patterned hard mask 606 as the etch mask, trench 610 is etched using dry etch and/or wet etch processes, such as RIE, through dielectric layer 604 until being stopped by substrate 602. In some embodiments, the width (in the x-direction) of trench 610 is greater than 100 nm. The remainder of hard mask 606 can be removed using dry etch and/or wet etch processes after the formation of trench 610.

After the formation of the trench, a conductive portion can be formed to fully fill the trench. The conductive portion can include a conductive layer and a core having a material different from that of the conductive layer. Another example of forming the conductive portion is illustrated with respect to operations 904, 906, 908, 911, 913, and 914 in method 901 of FIG. 9B. Method 901 proceeds to operation 904, as illustrated in FIG. 9B, in which the trench is partially filled with a first conductive material. In some embodiments, to partially fill the trench, the first conductive material is deposited over a sidewall and a bottom of the trench. The first conductive material can include a metal.

As illustrated in FIG. 6C, trench 610 is partially filled with conductive material 612. That is, trench 610 is not fully filled with conductive material 612, and only the sidewall and the bottom of trench 610 is filled with conductive material 612, leaving the remainder of trench 610 still open, according to some embodiments. In some embodiments, conductive material 612, such as a metal (e.g., W) is deposited over the sidewall and the bottom of trench 610 using one or more thin film deposition processes including, but not limited to, CVD, PVD, ALD, or any combination thereof. In order not to seal trench 610 by conductive material 612, a conformal coating process, such as ALD, can be used with control of the deposition time and/or cycles. The relatively large width of trench 610 (e.g., greater than 100 nm) can also facilitate the partially filling of trench 610 with conductive material 612. In some embodiments, an adhesion layer and/or a barrier layer, such as Ti/TiN, are formed between conductive material 612 and dielectric layer 604 prior to the deposition of conductive material 612 using one or more thin film deposition processes including, but not limited to, CVD, PVD, ALD, or any combination thereof.

Method 901 proceeds to operation 906, as illustrated in FIG. 9B, in which a remainder of the trench is filled with a gap-filling material. In some embodiments, to fill the remainder of the trench, the gap-filling material is spin-coated into the remainder of the trench. The gap-filling material can include at least one of a SOD, a SOC, a fluid organic material, or a fluid inorganic material. Operations 904 and 906 illustrate a dual trench-filling process including a partial filling process with the conductive material, followed by a full filling process with the gap-filling material, which can minimize the occurrence of seams and voids.

As illustrated in FIG. 6D, the reminder of trench 610 (shown in FIG. 6C) is filled with gap-filling material 614. As a result, trench 610 can be fully filled with conductive material 612 and gap-filling material 614 without seams and voids that are commonly found after the single trench-filling process without gap-filling material 614. In some embodiments, gap-filling material 614, such as SOD or SOC, fills the remainder of trench 610 using a spin-coating process. A spin-coating process is known to have a better gap-filling capability than CVD, e.g., forming a flat surface without voids and seams. In some embodiments, a post-baking process (e.g., using thermal or laser heating) is performed after the spin-coating process to further prevent the formation of voids or seams.

Method 901 proceeds to operation 908, as illustrated in FIG. 9B, in which the first conductive material and the gap-filling material are planarized until the top of the trench. As illustrated in FIG. 6E, conductive material 612 and gap-filling material 614 are planarized, such that the top surface of conductive material 612 and the top surface of gap-filling material 614 are flush with one another as well as with the top of trench 610 (shown in FIG. 6B). In some embodiments, excess conductive material 612 and gap-filling material 614 on the field region outside of trench 610 and above trench 610 are removed using a planarization process, such as CMP, grinding, and/or etch processes, until the top of trench 610. In some embodiments, the CMP process is stopped at the top surface of dielectric layer 604.

Method 901 proceeds to operation 911, as illustrated in FIG. 9B, in which a second conductive material is deposited on the planarized conductive material and the planarized gap-filling material. In some embodiments, the first conductive material is the same as the second conductive material. As illustrated in FIG. 8A, a conductive material 802 (e.g., the same material as conductive material 612) is deposited on planarized conductive material 612 and gap-filling material 614 as well as dielectric layer 604 using one or more thin film deposition processes including, but not limited to, CVD, PVD, ALD, or any combination thereof.

Method 901 proceeds to operation 913, as illustrated in FIG. 9B, in which the second conductive material is patterned to form the core and the conductive layer surrounding the core in the side view. As illustrated in FIG. 8A, a hard mask 804 is formed on conductive material 802 as an etch mask. In some embodiments, carbon or silicon oxynitride is deposited on conductive material 802 using one or more thin film deposition processes including, but not limited to, CVD, PVD, ALD, electroplating, electroless plating, or any combination thereof, to form hard mask 804. A photoresist layer 806 is formed on hard mask 804 using spin-coating and/or spray-coating processes, according to some embodiments. As illustrated in FIG. 8B, photoresist layer 806 can be patterned using a lithography process to define the area of a conductive plug to be formed from conductive material 802. In some embodiments, hard mask 804 is patterned using wet etch and/or dry etch processes to replicate the pattern from photoresist layer 806.

Figure 8C:
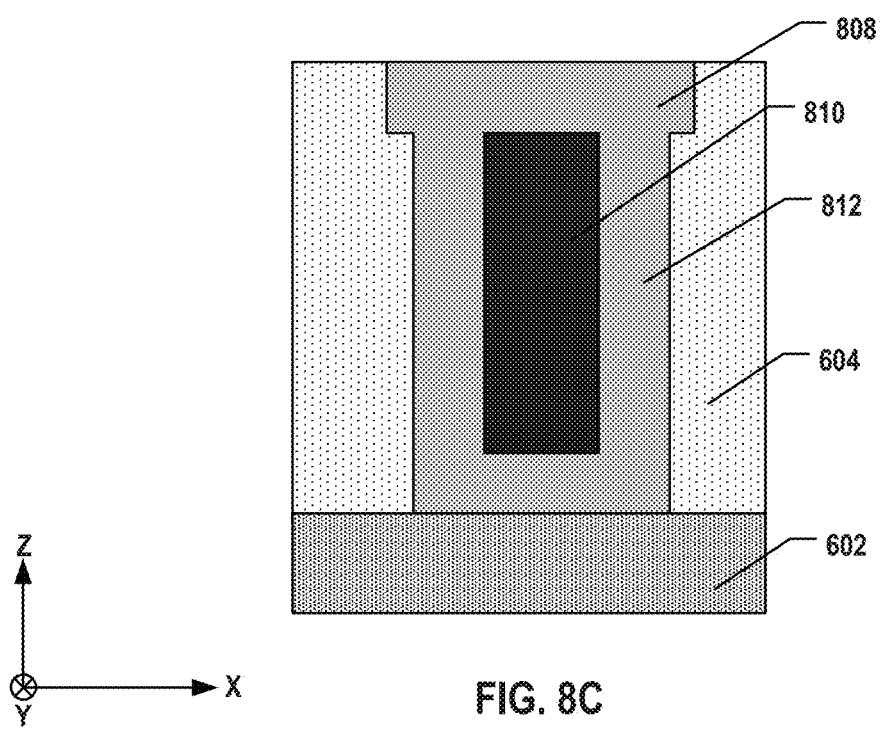
Figure 9B:
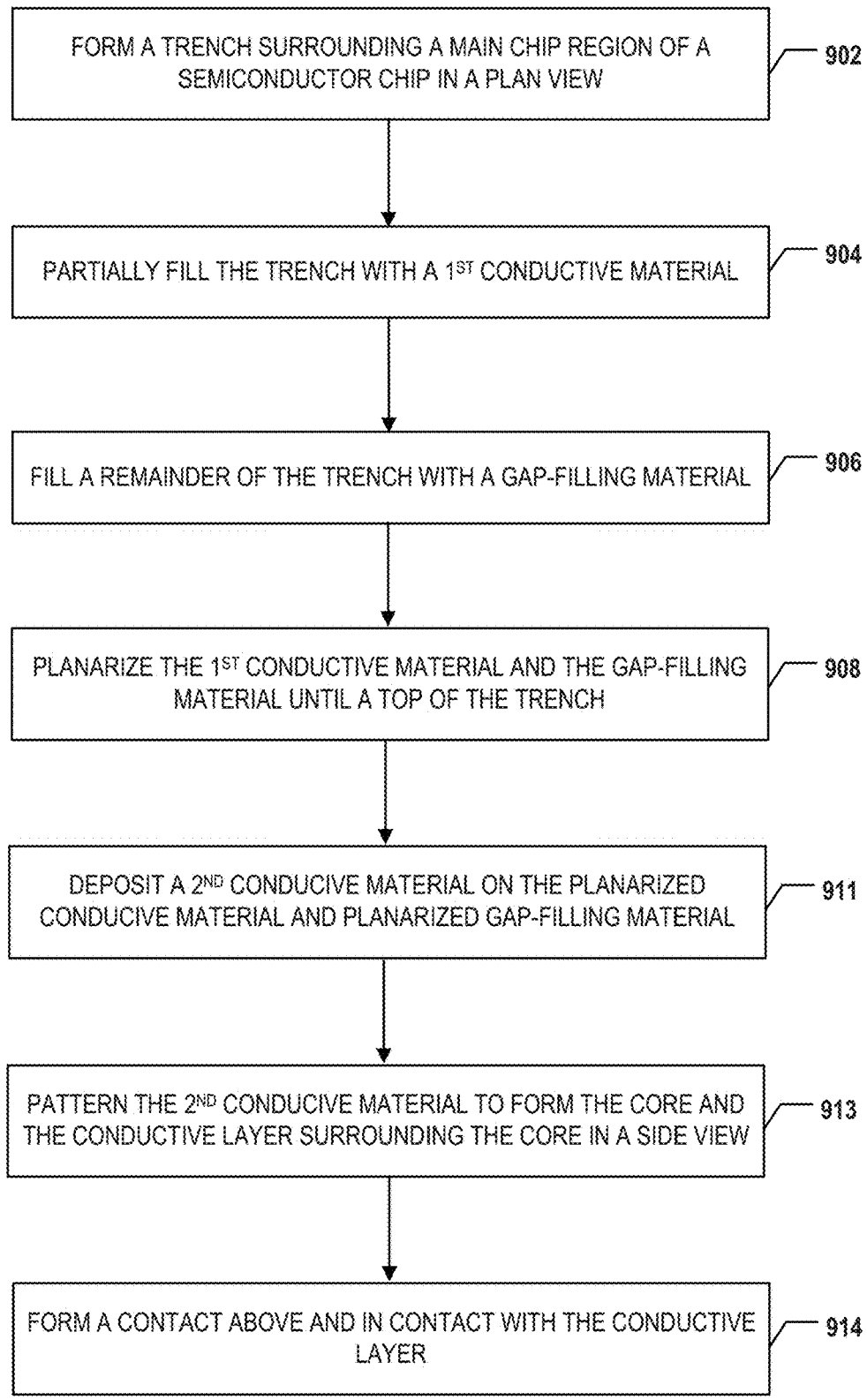
FIG. 9B is a flowchart of another exemplary method for forming a protection structure in a semiconductor chip, according to some embodiments of the present disclosure.

As illustrated in FIG. 8C, a conductive layer 812 surrounding a core 810 is formed on substrate 602 in dielectric layer 604. Conductive layer 812 can include conductive material 612 (shown in FIG. 8B) and a conductive plug 808 (i.e., patterned conductive material 812) on conductive material 612. Conductive plug 808 is formed by patterning conductive material 802 (shown in FIG. 8B) according to patterned hard mask 804 and photoresist layer 806, according to some embodiments. In some embodiments, using patterned hard mask 804 as the etch mask, conductive material 802 is etched using dry etch and/or wet etch processes, such as RIE, until being stopped by dielectric layer 604. The width (in the x-direction) of conductive plug 808 can be defined by patterned hard mask 804 and photoresist layer 806, either the same, larger than, or smaller than, the width of trench 610. The remainder of hard mask 804 can be removed using dry etch and/or wet etch processes after the formation of conductive plug 808. In some embodiments, the space created after etching conductive material 802 is filled with a dielectric material, thereby extending dielectric layer 604 vertically such that conductive plug 808 is disposed in dielectric layer 604 as well. Conductive layer 812 (including conductive material 612 and conductive plug 808) surrounding core 810 in the side view is thereby formed, according to some embodiments.

Figure 8D:
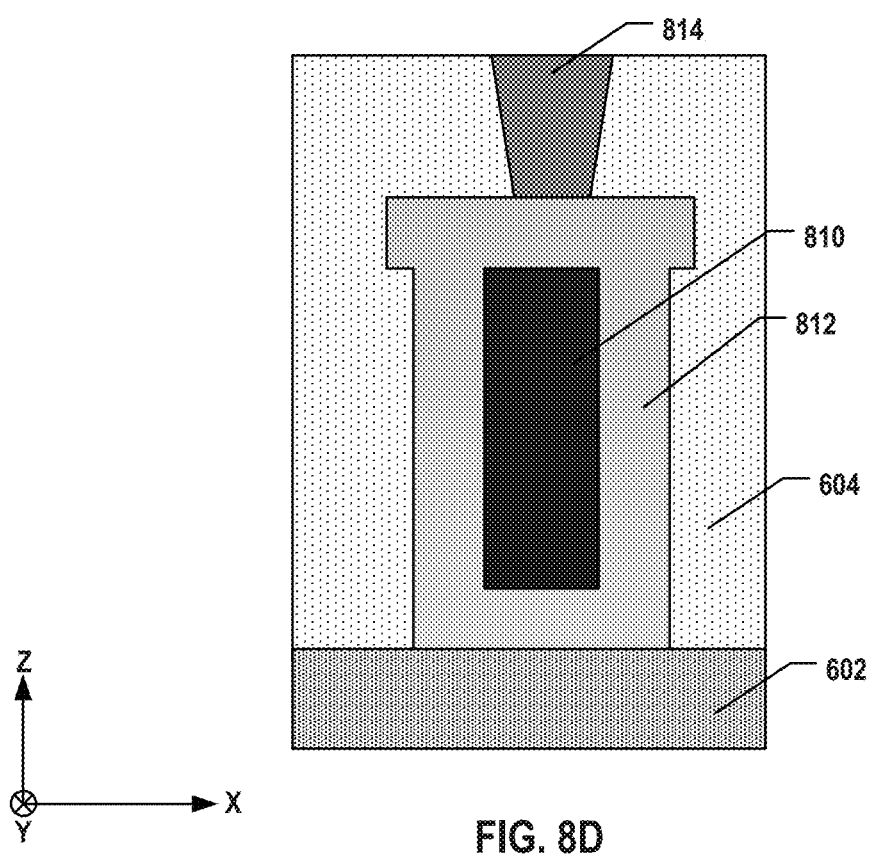

Method 901 proceeds to operation 914, as illustrated in FIG. 9B, in which a contact is formed above and in contact with the conductive layer. As illustrated in FIG. 8D, a contact 814 is formed above and in contact with conductive layer 812. In some embodiments, dielectric layer 604 is further extended vertically by depositing another dielectric layer on dielectric layer 604. Contact 814, such as a VIA, can be formed by patterning and etching a contact hole aligned with the top surface of conductive layer 812 using lithography and etch processes (e.g., RIE). One or more conductive materials, such as metals, can be deposited into the contact hole using one or more thin film deposition processes including, but not limited to, CVD, PVD, ALD, or any combination thereof, followed by a planarization process (e.g., CMP) to form contact 814. In some embodiments, a conductive portion including core 810, conductive layer 812 surrounding core 810, and contact 814 above and in contact with conductive layer 812 is thereby formed.

According to one aspect of the present disclosure, a semiconductor chip includes a main chip region and a protection structure surrounding the main chip region in a plan view. The protection structure includes a dielectric layer and a conductive portion in the dielectric layer. The conductive portion includes a conductive layer and a core having a material different from that of the conductive layer.

In some embodiments, the protection structure includes a single conductive portion.

In some embodiments, the protection structure includes four sides connected to enclose the main chip region in the plan view.

In some embodiments, a width of the conductive portion is greater than about 100 nm.

In some embodiments, the conductive portion further includes a contact above and in contact with the conductive layer in a side view. In some embodiments, the contact comprises a VIA.

In some embodiments, the material of the core includes a gap-filling material. In some embodiments, the gap-filling material includes at least one of a SOD, a SOC, a fluid organic material, or a fluid inorganic material.

In some embodiments, the conductive layer includes a metal.

In some embodiments, the core is surrounded by the conductive layer in a side view.

According to another aspect of the present disclosure, a semiconductor chip includes a main chip region and a protection structure surrounding the main chip region in a plan view. The protection structure includes a single conductive portion. The single conductive portion includes a conductive layer and a core surrounded by the conductive layer in a side view.

In some embodiments, the protection structure includes four sides connected to enclose the main chip region in the plan view.

In some embodiments, a width of the single conductive portion is greater than about 100 nm.

In some embodiments, the conductive portion further includes a contact above and in contact with the conductive layer in a side view. In some embodiments, the contact comprises a VIA.

In some embodiments, the conductive layer and the core include different materials.

In some embodiments, the material of the core includes a gap-filling material. In some embodiments, the gap-filling material includes at least one of a SOD, a SOC, a fluid organic material, or a fluid inorganic material.

In some embodiments, the conductive layer includes a metal.

According to still another aspect of the present disclosure, a method for forming a protection structure of a semiconductor chip is disclosed. A trench surrounding a main chip region of the semiconductor chip in a plan view is formed. A conductive portion is formed to fully fill the trench. The conductive portion includes a conductive layer and a core having a material different from that of the conductive layer.

In some embodiments, a contact is formed above and in contact with the conductive layer.

In some embodiments, a width of the trench is greater than about 100 nm.

In some embodiments, to form the conductive portion, the trench is partially filled with a first conductive material, a remainder of the trench is filled with a gap-filling material, and the first conductive material and the gap-filling material are planarized until a top of the trench.

In some embodiments, to partially fill the trench, the first conductive material is deposited over a sidewall and a bottom of the trench. In some embodiments, the first conductive material includes a metal.

In some embodiments, to fill the remainder of the trench, the gap-filling material is spin-coated into the remainder of the trench. In some embodiments, the gap-filling material includes at least one of a SOD, a SOC, a fluid organic material, or a fluid inorganic material.

In some embodiments, to form the conductive portion, a portion of the planarized gap-filling material is etched back to form the core and a recess on the core, and the recess is filled with a second conductive material to form the conductive layer surrounding the core in a side view.

In some embodiments, to form the conductive portion, a second conductive material is deposited on the planarized conductive material and the planarized gap-filling material, and the second conductive material is patterned to form the core and the conductive layer surrounding the core in a side view.

In some embodiments, the first conductive material is the same as the second conductive material.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a protection structure of a semiconductor chip, comprising:
    forming a trench surrounding a main chip region of the semiconductor chip in a plan view; and
    forming a conductive portion to fully fill the trench, comprising:
        partially filling the trench with a first conductive material;
        filling a remainder of the trench with a gap-filling material; and
        planarizing the first conductive material and the gap-filling material until a top of the trench,
    wherein the conductive portion comprises a conductive layer and a core having a material different from that of the conductive layer, wherein the core is completely enclosed by the conductive layer on all sides in a side view.

2. The method of claim 1, further comprising forming a contact above and in contact with the conductive layer.

3. The method of claim 1, wherein a width of the trench is greater than about 100 nm.

4. The method of claim 1, wherein partially filling the trench comprises depositing the first conductive material over a sidewall and a bottom of the trench.

5. The method of claim 1, wherein filling the remainder of the trench comprises spin coating the gap-filling material into the remainder of the trench.

6. The method of claim 1, wherein the gap-filling material comprises at least one of a spin-on coating dielectric (SOD), a spin-on coating carbon (SOC), a fluid organic material, or a fluid inorganic material.

7. The method of claim 1, wherein forming the conductive portion further comprises:

etching back a portion of the planarized gap-filling material to form the core and a recess on the core; and filling the recess with a second conductive material to form the conductive layer completely enclosing the core on all sides in a side view.

8. The method of claim 1, wherein forming the conductive portion further comprises:

depositing a second conductive material on the planarized conductive material and the planarized gap-filling material; and patterning the second conductive material to form the core and the conductive layer completely enclosing the core on all sides in a side view.

* * * * *